(12) United States Patent
Nguyen et al.

(10) Patent No.: US 9,305,648 B2
(45) Date of Patent: Apr. 5, 2016

(54) TECHNIQUES FOR PROGRAMMING OF SELECT GATES IN NAND MEMORY

(71) Applicant: SanDisk Technologies Inc., Plano, TX (US)

(72) Inventors: Hao Nguyen, San Jose, CA (US); Man Mui, Fremont, CA (US); Khanh Nguyen, Fremont, CA (US); Seungpil Lee, San Ramon, CA (US); Toru Ishigaki, Kanagawa (JP); Yingda Dong, San Jose, CA (US)

(73) Assignee: SanDisk Technologies, Inc., Plano, TX (US)

( * ) Notice: Subject to any disclaimer, the term of this patent is extended or adjusted under 35 U.S.C. 154(b) by 0 days.

(21) Appl. No.: 14/464,122

(22) Filed: Aug. 20, 2014

(65) Prior Publication Data

US 2016/0055911 A1    Feb. 25, 2016

(51) Int. Cl.
| | |
|---|---|
| G11C 16/04 | (2006.01) |
| G11C 16/20 | (2006.01) |
| G11C 16/24 | (2006.01) |
| G11C 16/26 | (2006.01) |
| G11C 16/34 | (2006.01) |
| G11C 16/10 | (2006.01) |

(52) U.S. Cl.
CPC ............ *G11C 16/0483* (2013.01); *G11C 16/10* (2013.01); *G11C 16/20* (2013.01); *G11C 16/24* (2013.01); *G11C 16/26* (2013.01); *G11C 16/3459* (2013.01)

(58) Field of Classification Search
CPC ....................................................... G11C 16/10
USPC ..................................................... 365/185.28
See application file for complete search history.

(56) References Cited

U.S. PATENT DOCUMENTS

| | | | |
|---|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,602,789 A | 2/1997 | Endoh et al. |
| 5,661,053 A | 8/1997 | Yuan |
| 5,673,222 A | 9/1997 | Fukumoto et al. |

(Continued)

OTHER PUBLICATIONS

U.S. Appl. No. 13/927,659 entitled "System for Maintaining Back Gate Threshold Voltage in Three Dimensional NAND Memory," filed Jun. 26, 2013, 41 pages.

(Continued)

*Primary Examiner* — Son Mai
(74) *Attorney, Agent, or Firm* — Sterne, Kessler, Goldstein & Fox P.L.L.C.

(57) ABSTRACT

In a non-volatile memory formed according to a NAND-type architecture that has, on one or both ends of the NAND strings, multiple select gates including some with programmable threshold voltages, a structure and corresponding for efficiently programming of such select gates. On the drain side, the end most of multiple drain select transistors is individually controllable and used for biasing purposes while one or more other drain side select gates are collectively programmed to set adjust their threshold voltage. Independently, on the source side, the end most of multiple source select transistors is individually controllable and used for biasing purposes while other source side select gates are collectively programmed to set adjust their threshold voltage.

22 Claims, 18 Drawing Sheets

(56) References Cited

U.S. PATENT DOCUMENTS

| | | |
|---|---|---|
| 5,768,192 A | 6/1998 | Eitan |
| 5,903,495 A | 5/1999 | Takeuchi et al. |
| 6,011,725 A | 1/2000 | Eitan |
| 6,046,935 A | 4/2000 | Takeuchi et al. |
| 6,222,762 B1 | 4/2001 | Guterman et al. |
| 7,433,231 B2 * | 10/2008 | Aritome .................... 365/185.17 |
| 7,470,948 B2 * | 12/2008 | Park et al. ...................... 257/314 |
| 8,964,473 B2 * | 2/2015 | Dong et al. .............. 365/185.12 |
| 9,053,796 B2 * | 6/2015 | Shim ........................ 365/185.18 |
| 2014/0003157 A1 | 1/2014 | Mui et al. |
| 2014/0169095 A1 | 6/2014 | Avila et al. |

OTHER PUBLICATIONS

U.S. Appl. No. 13/925,662 entitled High Capacity Select Switches for Three-Dimensional Structures, filed Jun. 24, 2013, 36 pages.

Eitan et al., "NROM: A Novel Localized Trapping, 2-Bit Nonvolatile Memory Cell," IEEE Electron Device Letters, vol. 21, No. 11, Nov. 2000, pp. 543-545.

* cited by examiner

Programming into four states represented by a 2-bit code

TECHNIQUES FOR PROGRAMMING OF SELECT GATES IN NAND MEMORY

BACKGROUND

This application relates to the operation of re-programmable non-volatile memory systems such as semiconductor flash memory that record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

In a first set of aspects, a non-volatile semiconductor memory device has a memory array structure that includes a first bit line, a source line, and a first NAND string. The first NAND string includes: a plurality of non-volatile memory cells connected in series between the source line and the first bit line; one or more serially connected source select transistors through which the memory cells are connected to the source line; and a plurality of serially connected drain select transistors through which the memory cells are connected to the first bit line, wherein the serially connected drain select transistors include a first drain select transistor and one or more second drain select transistors, wherein the second drain select transistors have a programmable threshold level and are connected to the first bit line through the first select drain transistor. The memory array structure also includes read/write circuitry connectable to the first bit line, the source line, and the control gates of the memory cells, and the control gates of the source and drain select transistors. The second drain select transistors are programmed by applying a sequence of one or more common programming pulses concurrently to the control gates of the second drain select transistors while the first bit line is initially set to a program enable level, the source line is set high, the control gates of the memory cells are set at a pass level, one or more of the source select transistors are turned off, and the first drain select transistor is turned on.

In other aspects, a non-volatile semiconductor memory device has a memory array structure that includes a first bit line, a source line, and a first NAND string. The first NAND string includes: a plurality of non-volatile memory cells connected in series between the source line and the first bit line; one or more serially connected drain select transistors through which the memory cells are connected to the first bit line; and a plurality of serially connected source select transistors through which the memory cells are connected to the source line, wherein the serially connected source select transistors include a source drain select transistor and one or more second source select transistors, wherein the second source select transistors have a programmable threshold level and are connected to the source line through the first source drain transistor. The memory array structure also includes read/write circuitry connectable to the first bit line, the source line, and the control gates of the memory cells, and the control gates of the source and drain select transistors. The second source select transistors are programmed by applying a sequence of one or more common programming pulses concurrently to the control gates of the second source select transistors while the first bit line is initially set to a program enable level, the source line is set high, the control gates of the memory cells are set at a pass level, the first source select transistor is turned off, and the drain select transistors are turned on.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorpo-

DETAILED DESCRIPTION

Memory System

Figure 1:
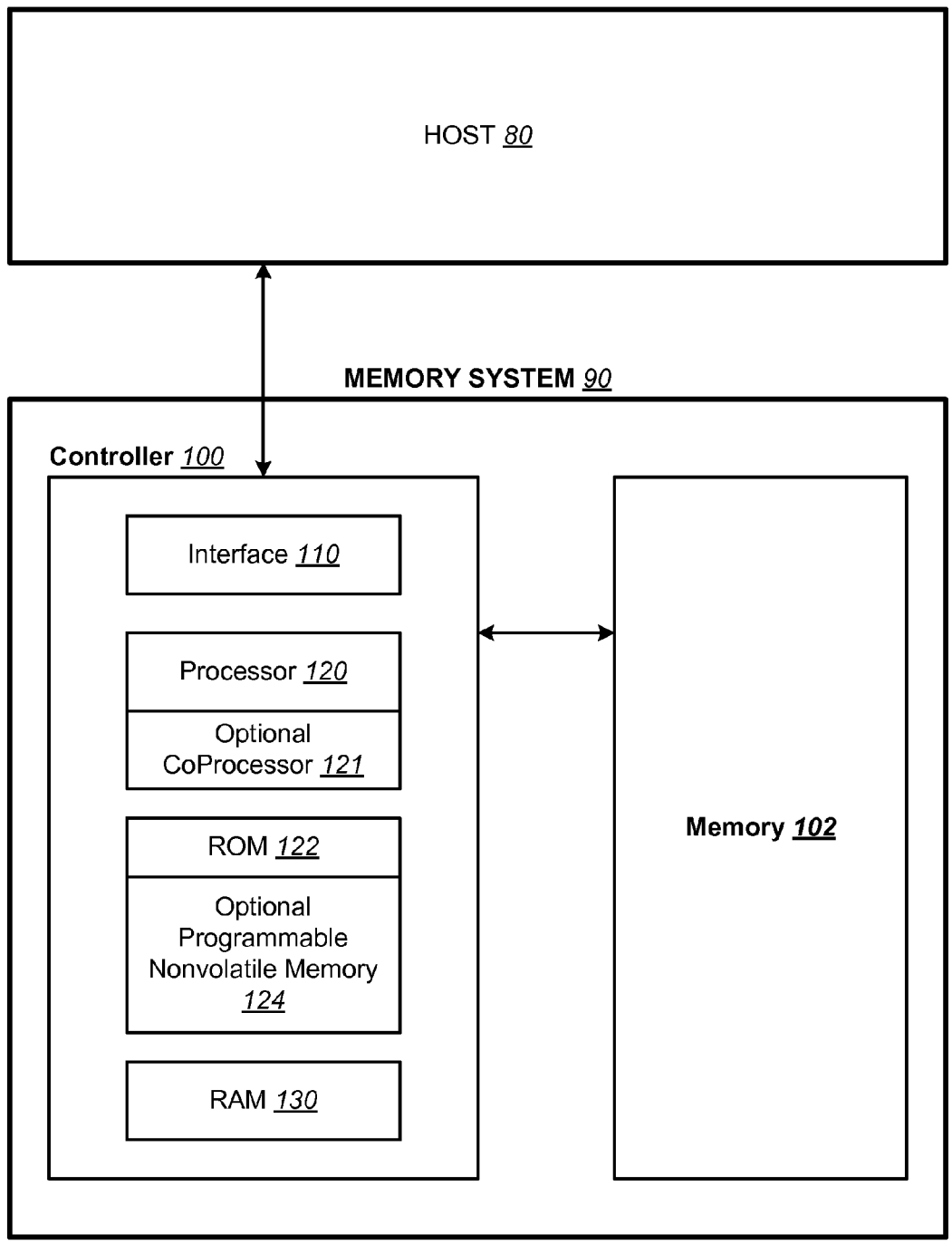
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

Physical Memory Structure

Figure 2:
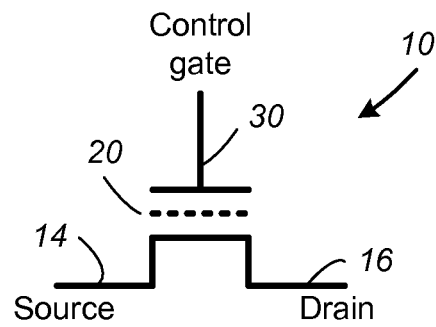
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
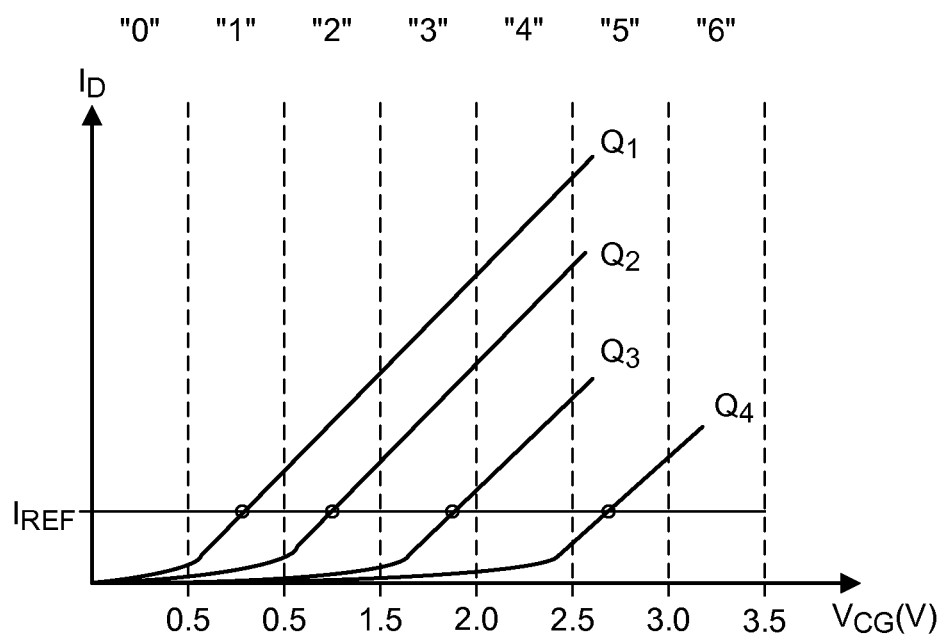
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
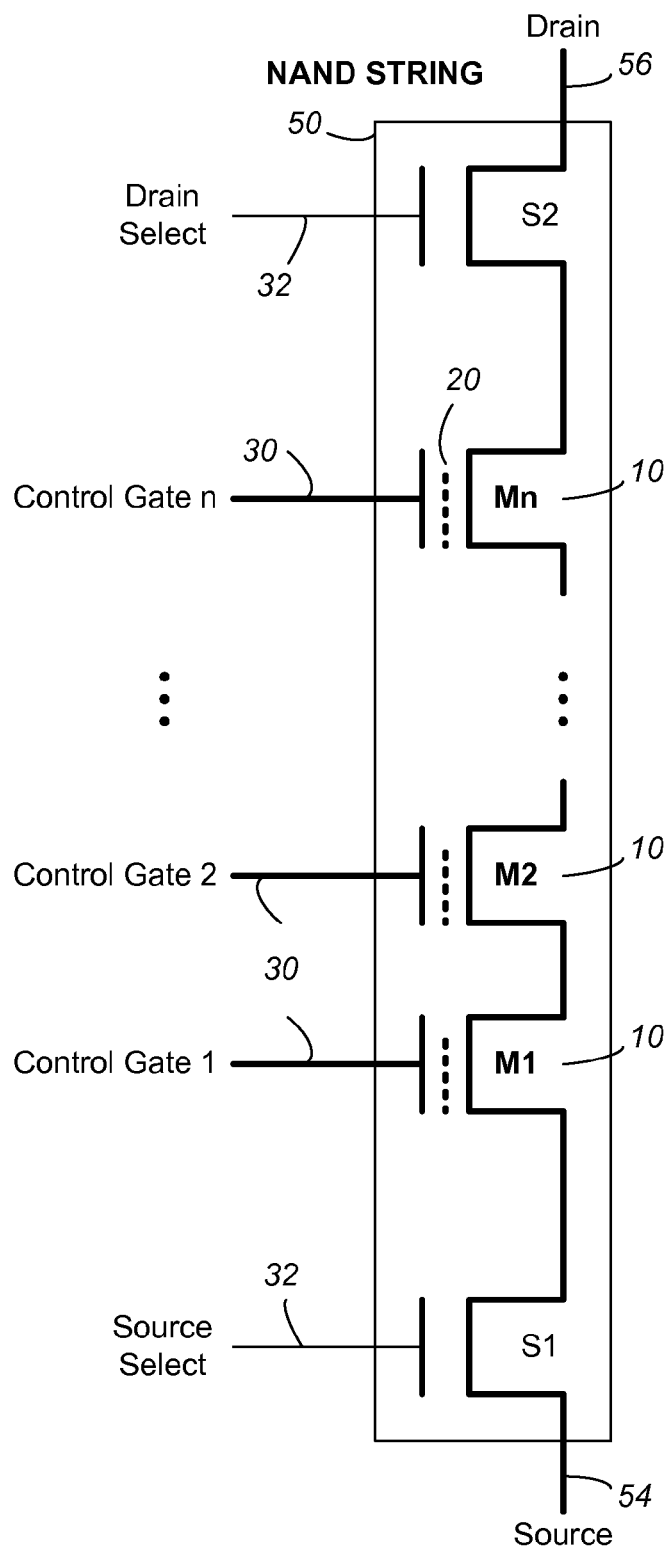
FIG. 4 illustrates schematically a string of memory cells organized into a NAND string.

FIG. 4 illustrates schematically a string of memory cells organized into a NAND string. A NAND string 50 comprises a series of memory transistors M1, M2, ... Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5:
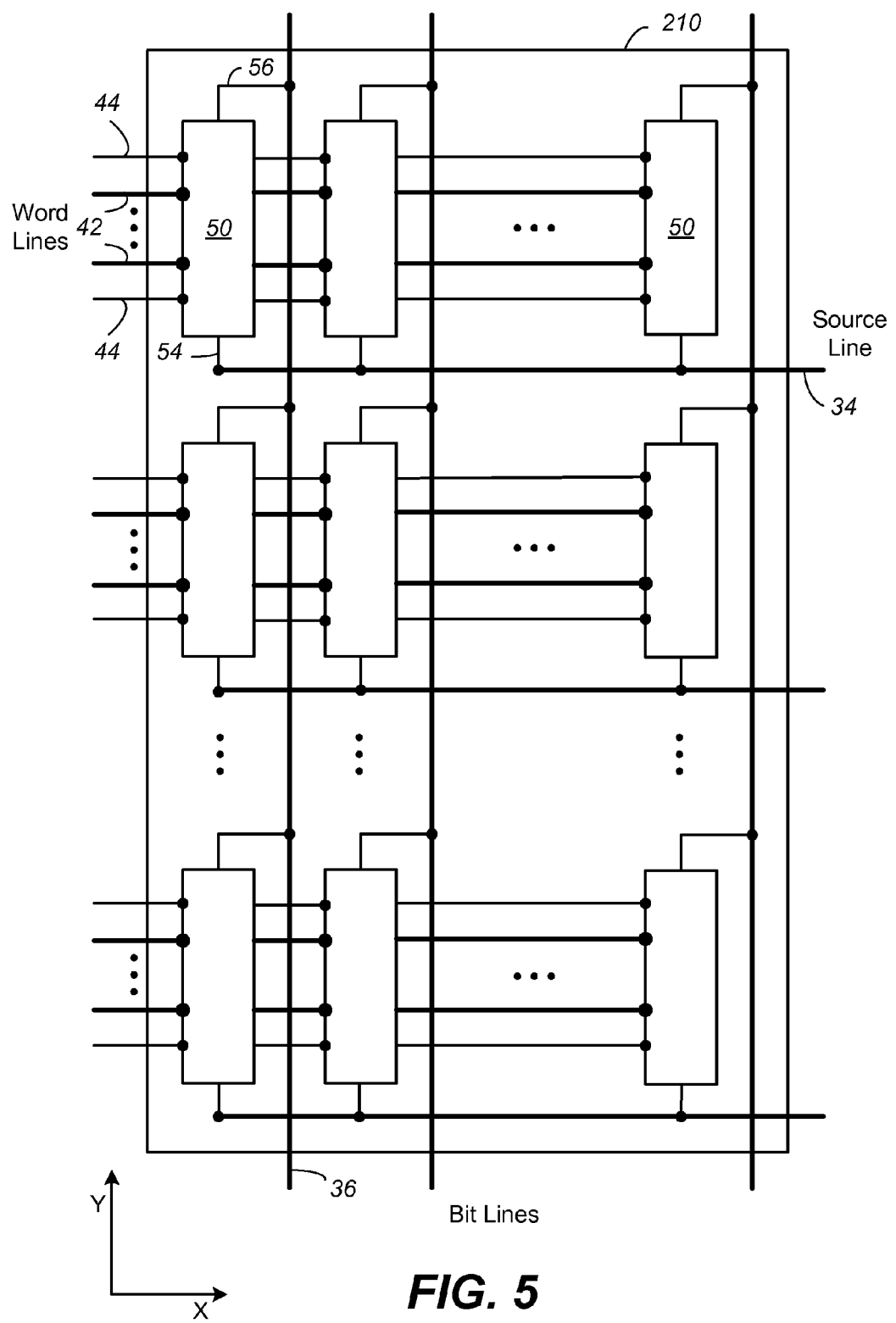
FIG. 5 illustrates an example of a NAND array 210 of memory cells, constituted from NAND strings 50 such as that shown in FIG. 4.

FIG. 5 illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 6:
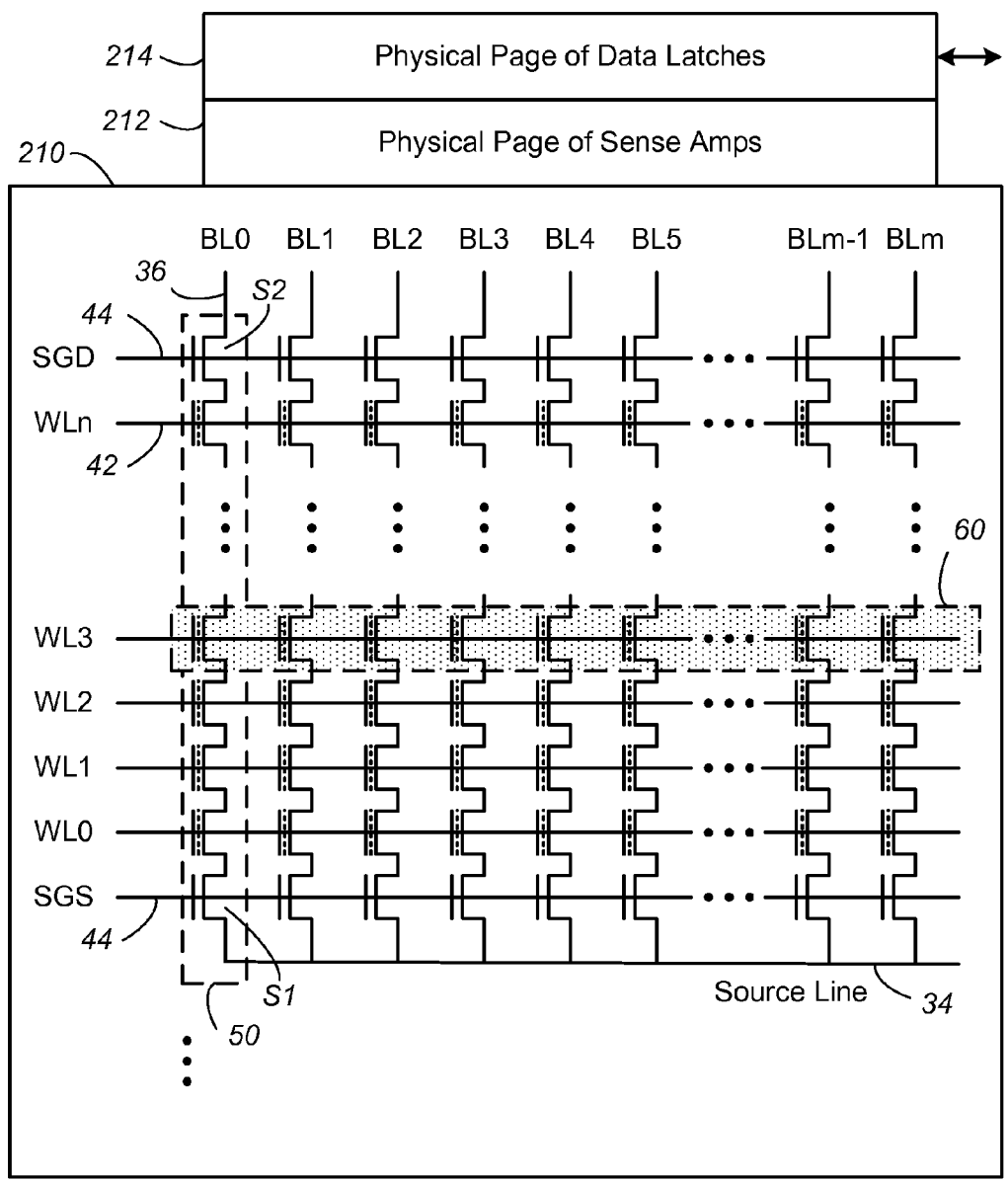
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7:
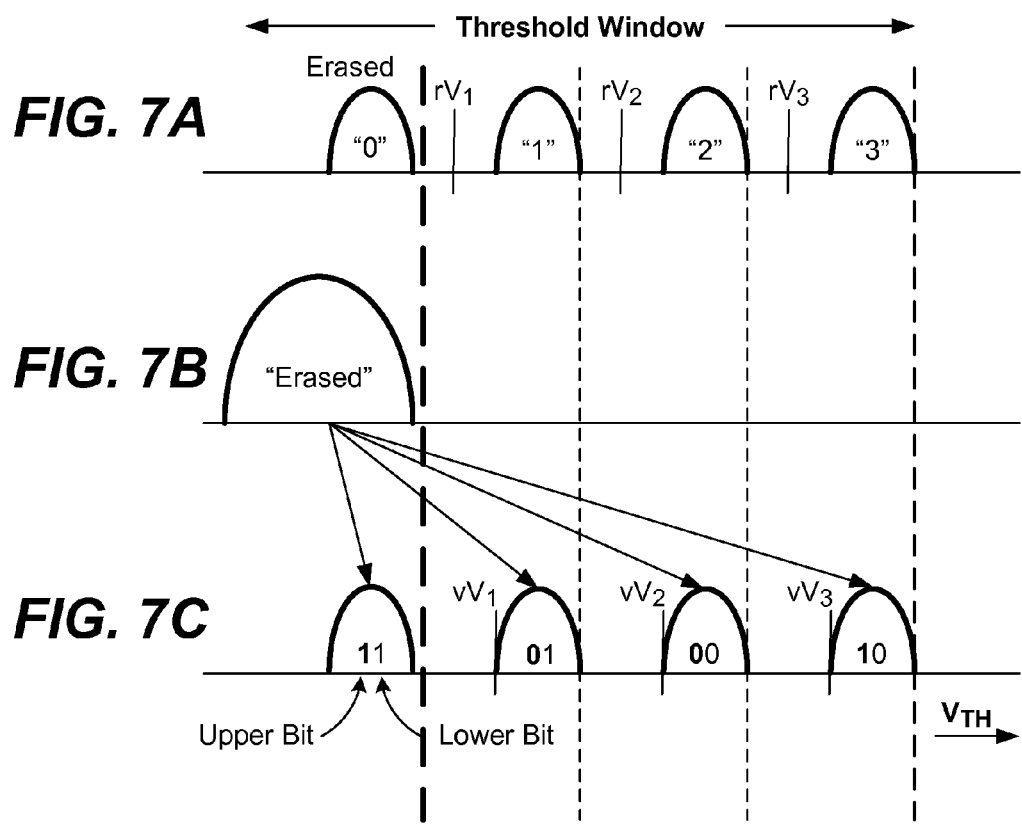
FIGS. 7A-7C illustrate an example of programming a population of memory cells.

FIGS. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 7C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three subpasses respectively.

3-D NAND Structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 8:
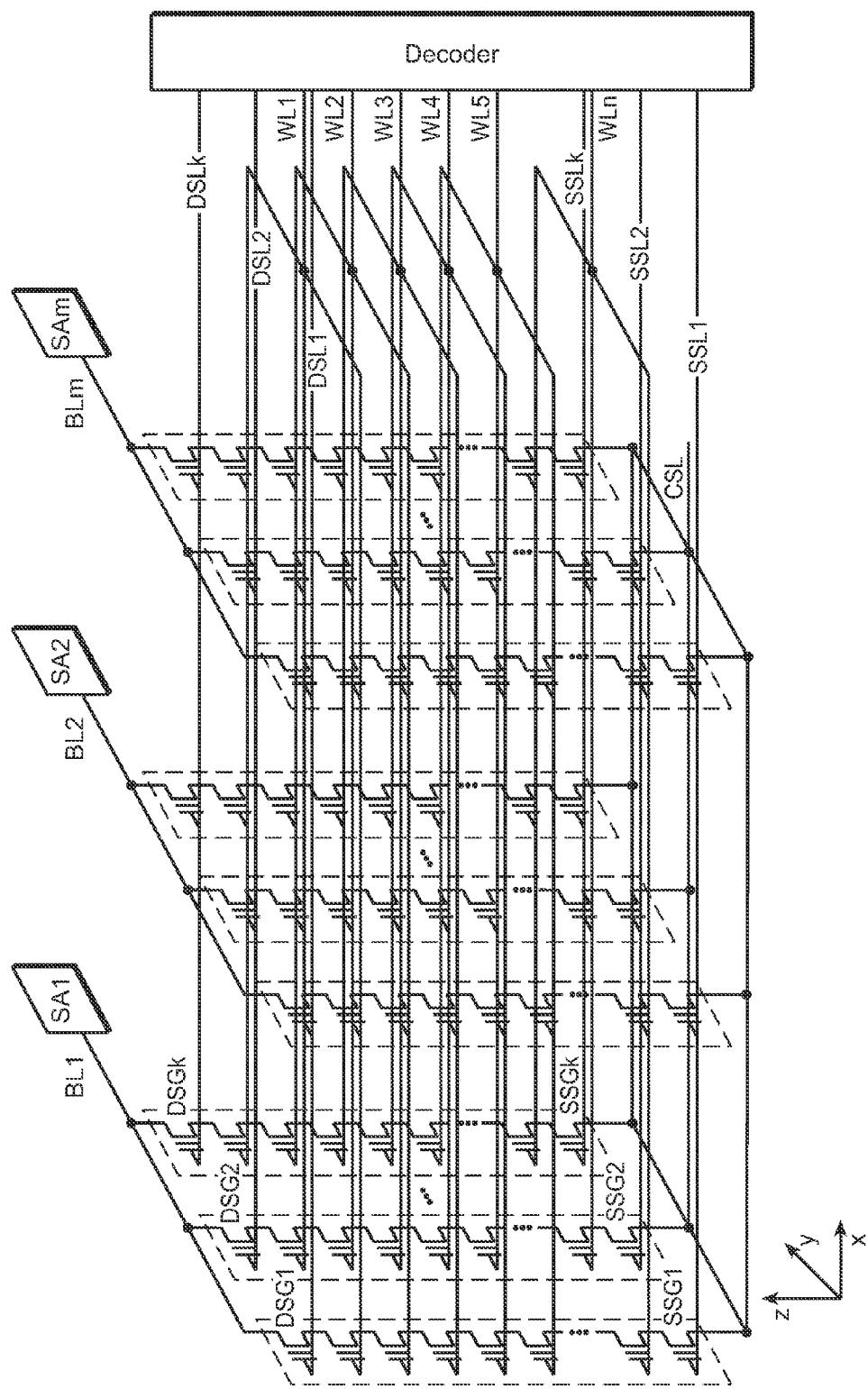
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-$m$, each run across the top to an associated sense amp SA1-$m$. The word lines, WL1-$n$, and source and select lines SSL1-$n$ and DSL1-$n$, then run in x direction, with the NAND string connected at bottom to a common source line CSL.

Figure 9:
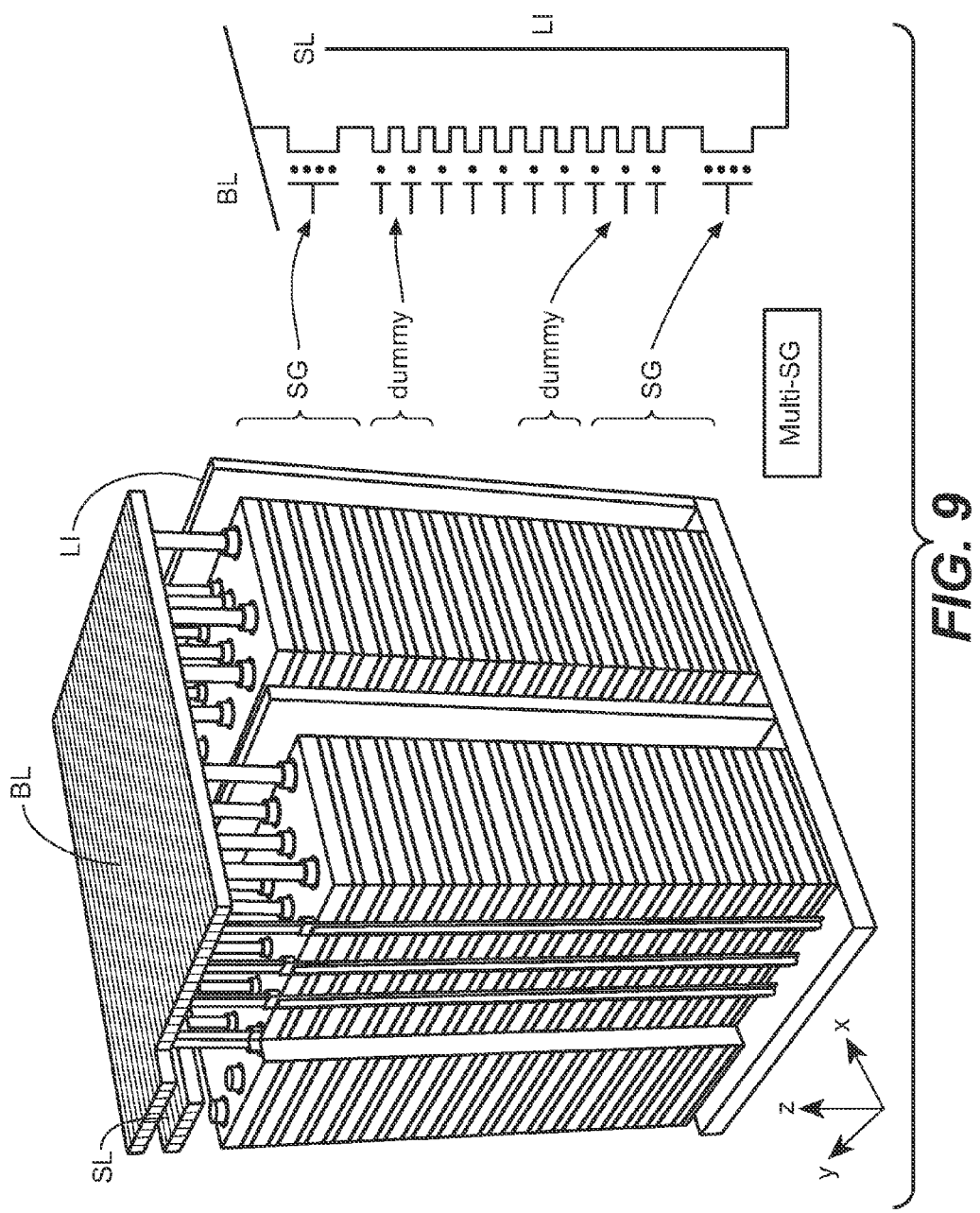
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up, such as is described in U.S. patent application Ser. No. 13/927,659, filed on Jun. 26, 2013.

To the right of FIG. 9 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series (as described in U.S. patent application Ser. No. 13/925,662, filed on Jun. 24, 2013), making for more uniform processing of layers. Additionally, the select gates are programmable to have their threshold levels adjusted, aspects of which are described in US patent publication number 2014-0169095. This exemplary embodiment also includes several dummy cells at the ends that are not used to store user data, as their proximity to the select gates makes them more prone to disturbs.

Figure 10:
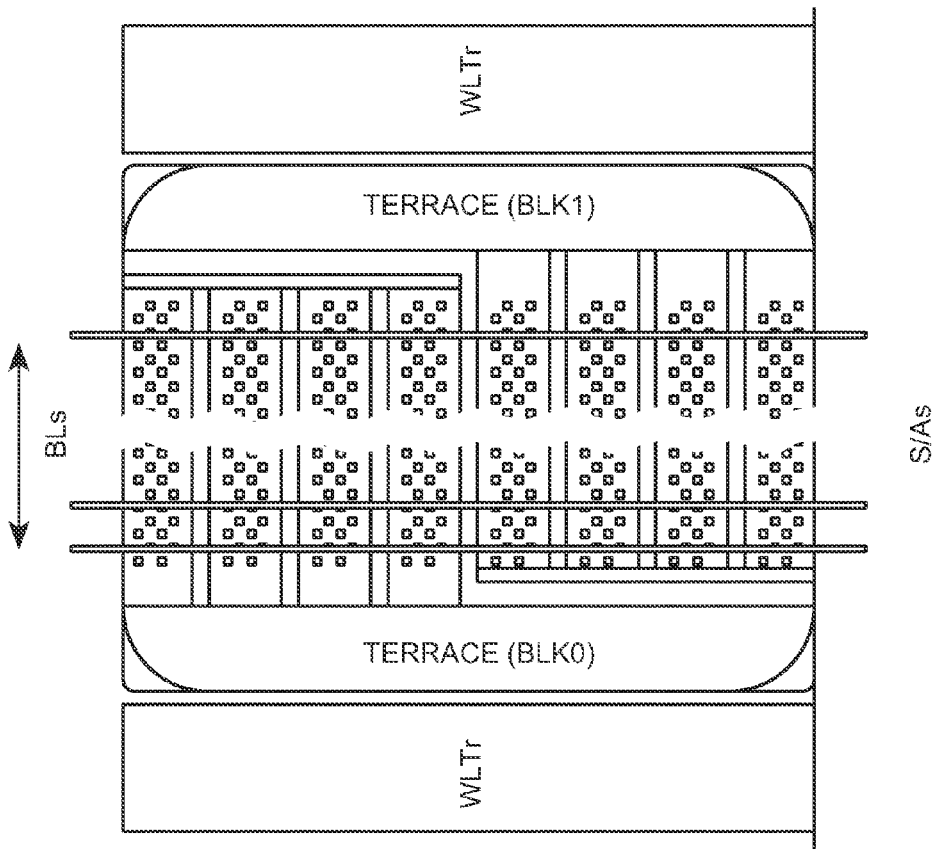

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
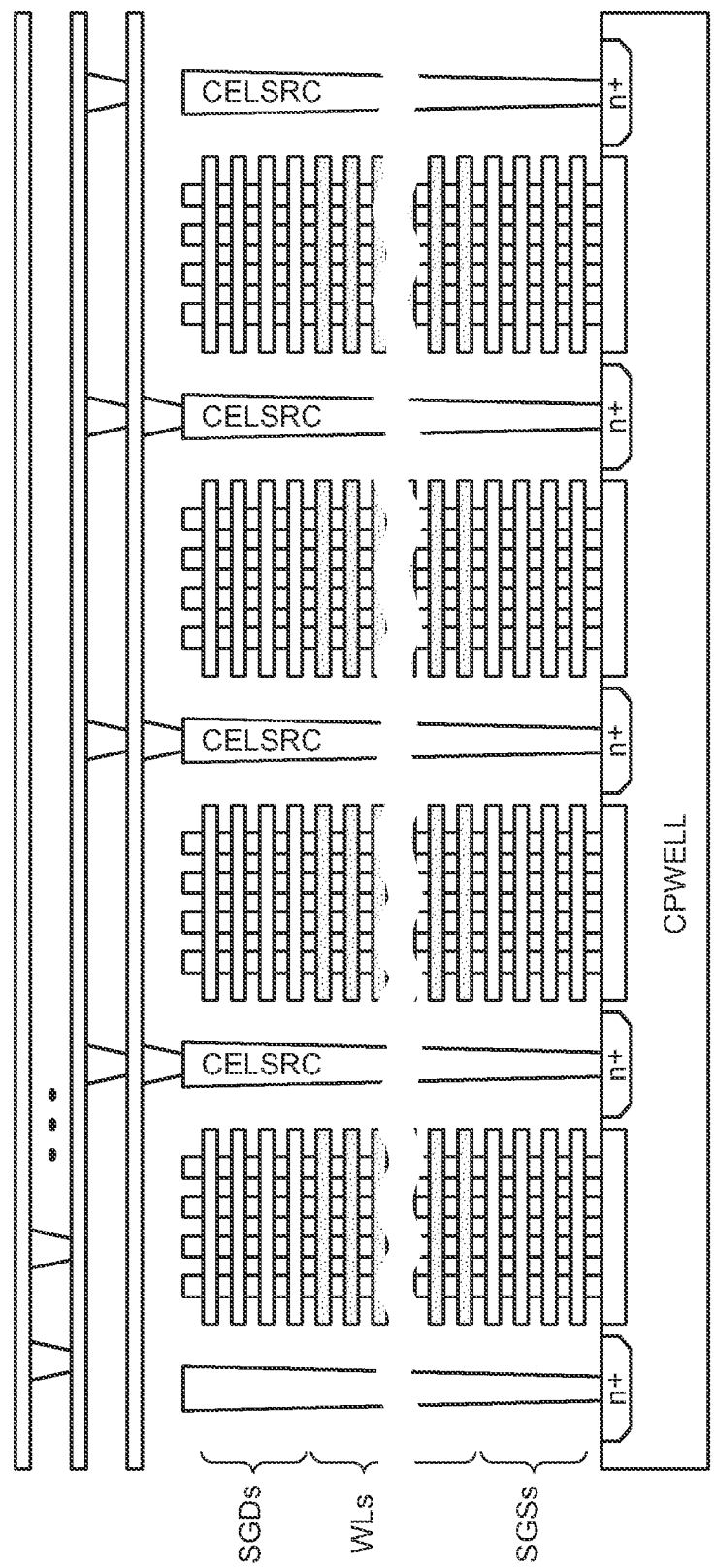

FIG. 11 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
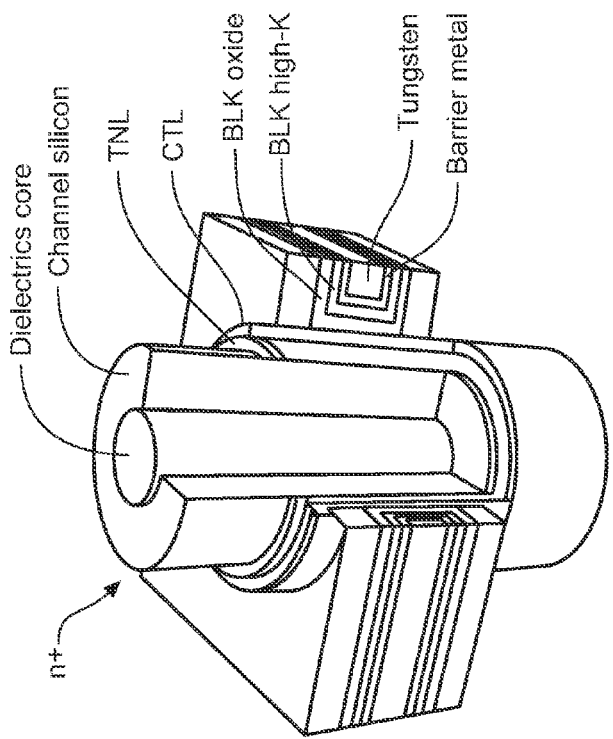

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Fast Programming of Select Gates Suitable for BiCS (3D) Memory Technology

As noted in the preceding section, the sort of memory structure described with respect to FIGS. 9-12 present a memory structure having a NAND type of architecture in which the select gates are programmable. This section considers techniques for programming these select gates. The select gates differ from the memory cells, among other ways, in that they are directly connected to either the bit line on the one end of the NAND string or to the source line on the other, whereas the memory cells have these select gates separating them from these lines to be used to control the bias levels to the memory cells. This makes accurately setting the threshold voltage (Vt) of the select gates trickier that the usual programming of a strings memory cells. More obviously, the select gates differ in that they have their Vt programmed in order allow them to properly perform their function, as opposed to storing data values. As this sort of structure arises in the BiCS type structure described in the last section, the following is presented in that context, although it is more generally applicable to other NAND type architectures having select gates with tunable threshold levels.

Figure 13:
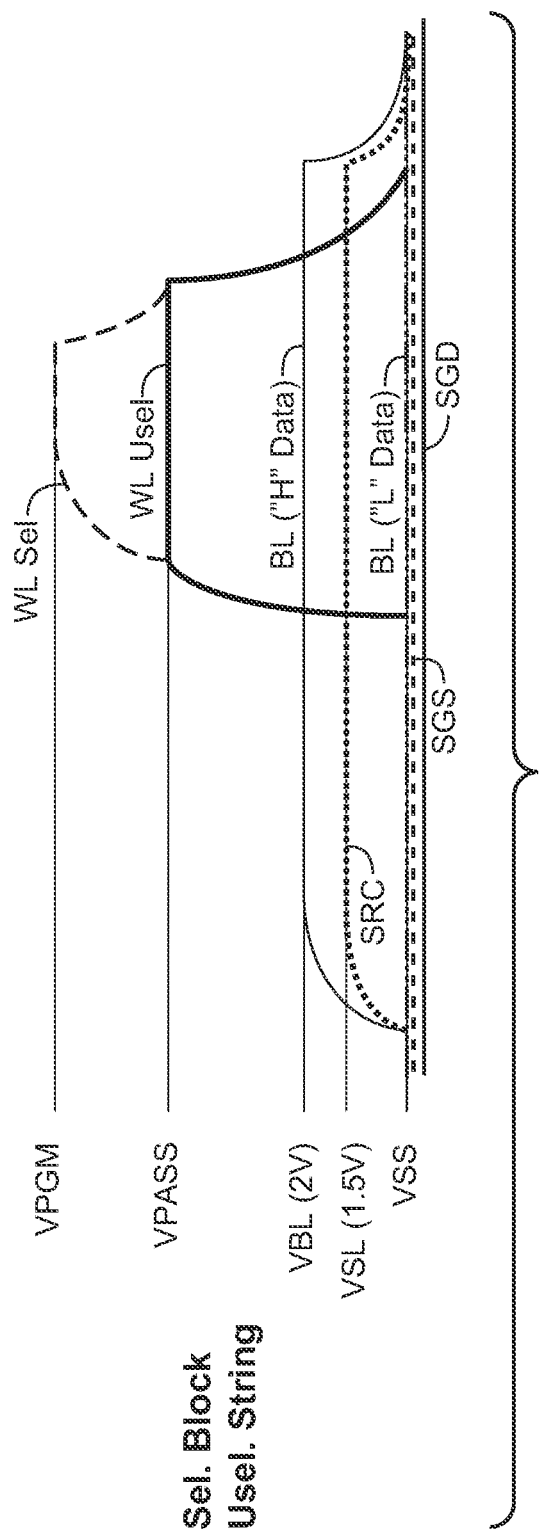
FIG. 13 shows a typical set of bias waveforms for programming selected memory cells in a NAND type memory.
Figure 14A:
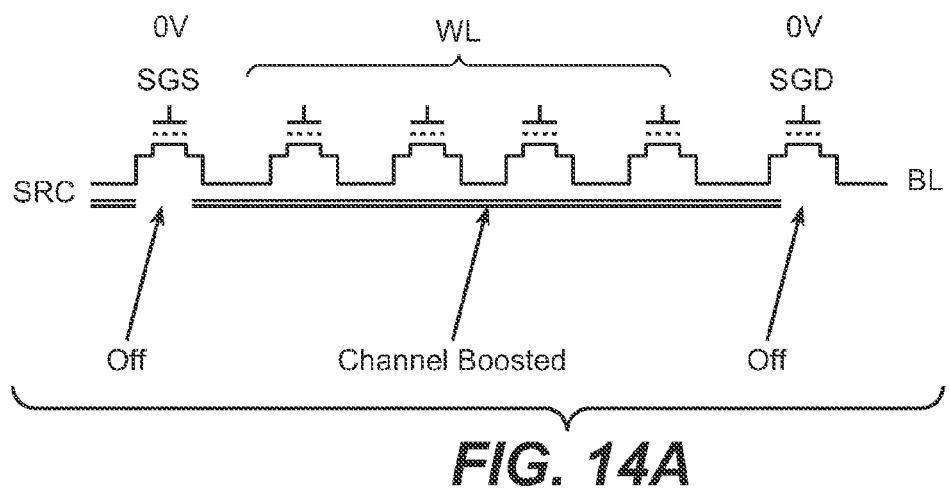
FIGS. 14A and 14B schematically illustrate the effects on the programming of a string of memory cells when the selected gates respectively have positive and negative threshold voltages.
Figure 14B:
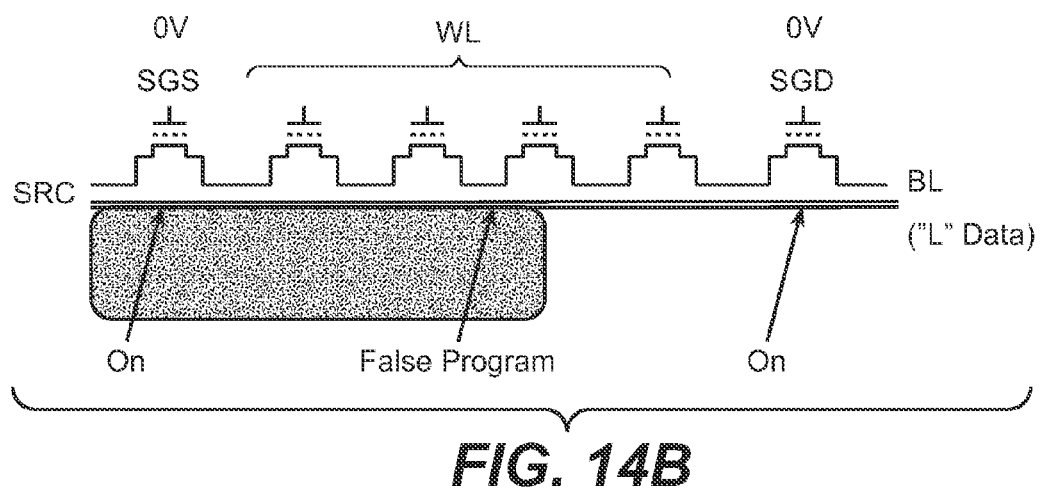

The need for properly setting the select gates' threshold voltages can be illustrated with respect to FIGS. 13, 14A, and 14B. FIG. 13 shows a typical set of bias waveforms for programming selected memory cells in a NAND type memory. The source (SGS) and drain (SGD) side select gates are set low to ground (VSS), as are the bit lines (BL) corresponding to cells to be programmed, while program disabled bit lines are set to a VBL level (2V in this example) and the source line is set at VSL (here 1.5V). The non-selected word lines are then taken to VPASS and the selected word lines up to the full program voltage of VPGM. The result, for a NAND string with properly tuned selected gates having a positive threshold voltage is shown at FIG. 14A: the select gates are off, the channel is boosted, and programming occurs. If, instead, the selects were to have a negative threshold voltage (SG Vt<0V) as illustrated in FIG. 14B, they will conduct even though their gates are at 0V, and the selected memory cells will not program properly.

Figure 15:
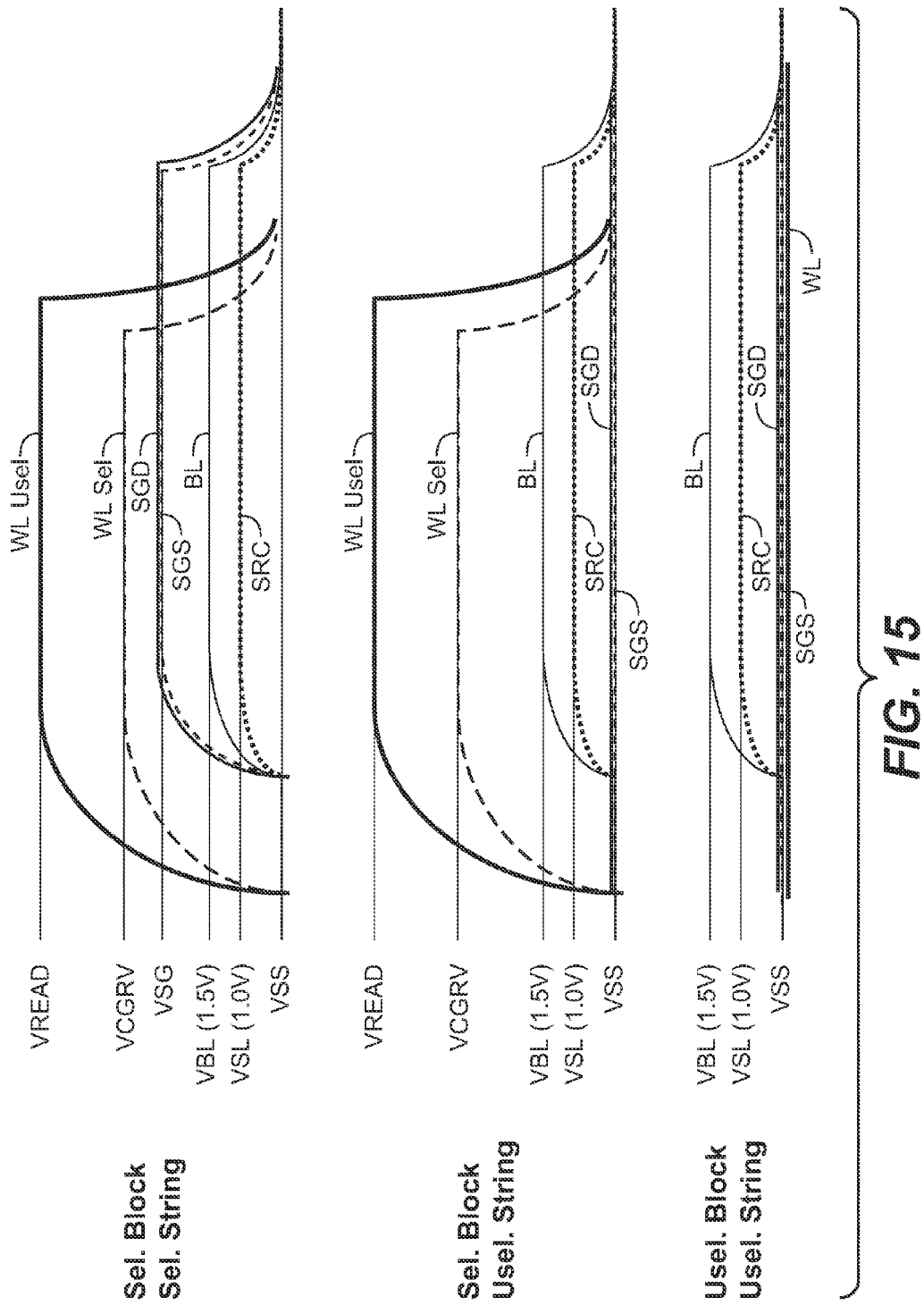
FIG. 15 shows an exemplary set of bias voltages for sensing operation.
Figure 16:
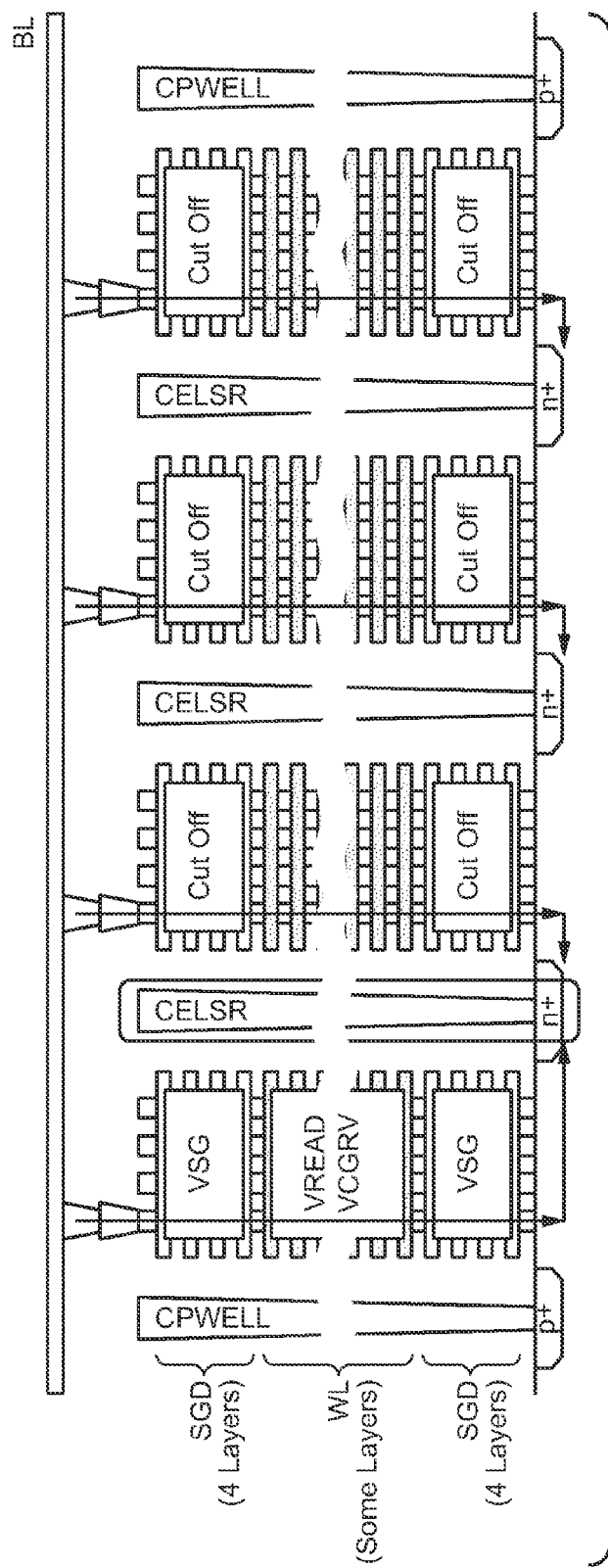
FIG. 16 illustrates the mechanism whereby an unselected NAND string having select gates with negative thresholds can affect a sensing operation in the 3D context.

Negative select gate threshold voltages can also cause problems when reading. FIG. 15 shows an exemplary set of bias voltages for selected and unselected word line, source and drain select gates, bit lines and source lines for a selected string in a selected block (top), an unselected string in a selected block (middle), and unselected string from unselected blocks (bottom). For selected strings, both source and drain selects should be on (at VSG) so the selected cells can be read; but for unselected strings in both selected and unselected blocks, the select gates are set biased at VSS so that they are turned off and will not contributed to the result of the sensing operation. However, if any of the select gates in the unselected string (in either selected or unselected blocks) have negative thresholds, they may be on to some degree and affect the result of the read operation and lead to inaccurate sensing. FIG. 16 illustrates the mechanism in the BiCS context: here, the string at the left of the left most finger is selected, with any current flowing off to the source line CELSR, as indicated by the arrow. However, if the strings along the same bit line of the other fingers are not fully cut off by their select gates, they may also have some current flowing, as indicated at the lighter arrows, affecting the sensing result.

Figure 17:
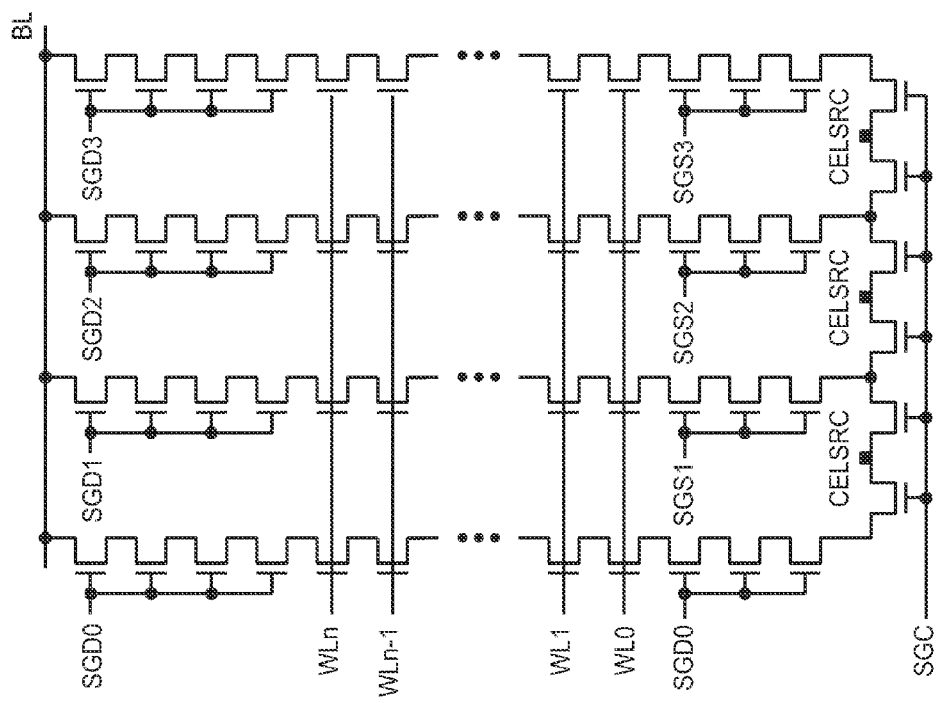
FIG. 17 is a two dimensional projection of a block of a typical BiCS type structure, showing one NAND string sharing a common bit line for each of four finger, to illustrate some of the structure on how the select gates and memory cells are arranged.

FIG. 17 is a two dimensional projection of a block of a typical BiCS type structure, showing one NAND string sharing a common bit line for each of four finger, to illustrate some of the structure on how the select gates and memory cells are arranged. Each finger has its individually controllable set of drain select gates, SGD0-3, and source select gates, SGS0-3, along with the common source gate. The word lines WL0-$n$ then run across all four fingers. The select gates can then be programmed similarly to the process for memory cells, but with some differences. As with the memory cells, programming pulses are applied to the control gates (now by way of the select lines, rather than word lines) with intervening verify operations, but where these are a collective verify for the commonly controlled sets of select gates; that is, the four select gates all controlled by SGD0 would be verified as a unit, where they are being programmed to tune their threshold voltage as opposed to storing a data value.

A difficulty in programming these sets of select gates is that, unlike the memory cells along the word lines, they are not separated from the bit line BL by a separate select gate on the drain end nor are they separated from the source line on the other end. This lack of a "select gate for the select gates" make it difficult to set the proper bias levels allowing the select gates to be programmed in the same way as the memory cells. For instance, on the drain side this means that the bit line needs to be biased to higher level that is typically provided by the sense amp in order to inhibit programming, requiring an elevated level from a charge pump. And the common SGC line and CELSRC level does not allow for inhibiting the source side selected transistors of individual fingers. Also, due the amount of coupling due to the density of the BiCS structure, it is often difficult to program along all of the bit lines, whether for word lines or select gates together, so that only every other or even every fourth bit line is done concurrently.

Figure 18:
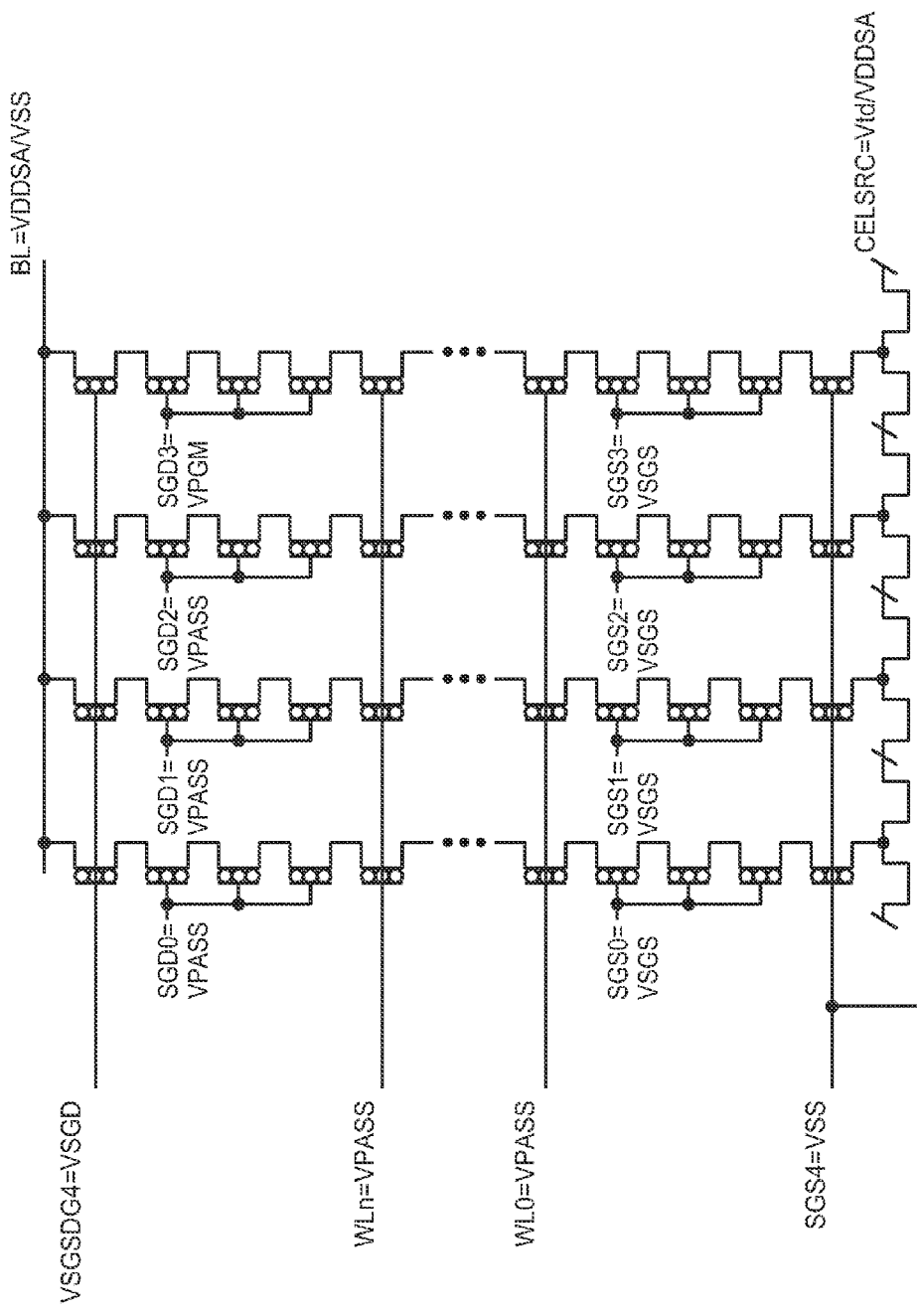
FIG. 18 illustrates an exemplary topology for the control gate connections of drain side select gates and bias levels for their programming.

To overcome these limitations, the exemplary embodiment uses a modified structure for the select gates. On the drain side, the end select gate connected to the bit line is separately controllable from the other drain side select gates, allowing to be used more typically like a drain side select gate during the programming of the other drain side select gates, which can still be commonly controlled. On the source side, the end select gate connected to the local common source line is also controllable separately from the other source side select gates, allowing it to be biased separately for programming of the other source select gates. This structure is illustrated in FIG. 18, which can be compared to FIG. 17. The levels shown are for programming the three drain select transistors on the right most NAND string.

In FIG. 18 four NAND strings, one each from four fingers of a block, are shown. On the drain side, the three select gates adjacent to the word lines in each finger again have commonly connected control gates. The end most drain select gate, through which the finger connects to the bit line BL, is controlled separately. In the exemplary embodiment the end select gates of the four fingers are all connected along the same control line SGD4. A similar structure is used along the bottom, with the bottom transistors of the four fingers, through which each NAND strings connects to the local source line, commonly connected along control line SGS4, which also controls the transistors between the NAND strings and the source line inter-connect columns. The exemplary embodiments here, such as that illustrated in FIG. 18, have four select gates on either end of each NAND string, where the end-most of each set is controlled independently of the other three, which are commonly controlled, but the techniques of the section are more generally applicable. For example, on either end, one or more end-most select transistors can serve a more or less standard select gate function while programming of one or more additional select transistors with adjustable thresholds to the inside, where this can be implemented independently on either the source or drain sides. Consequently, the threshold tuning of select gates' threshold becomes similar to the programming of memory cells, but where (when there is more than one of such adjustable Vt select gates) the verify is a combined verify and rather than being written to a data state they are having there thresholds set to a well-defined level to allow proper operation of the NAND string.

When the right most finger of FIG. 18 is selected for programming of the threshold on the source side select gates, all of the word lines are treated as unselected and set at the programming pass level VPASS (typically on the order of 10V), as are the levels SGD0-2 on the drain side select gates of non-selected fingers. The source side select gate level SGS0-3 are set to VSGS, a level sufficient to turn them on. The end source side select gate line SGS4 is set to VSS (0V) to shut off the NAND string on the source end and also the gates between local source line interconnects. The end most drain side select gate control line SGD4 is then set at VSGD, a value so that it either conducts or is off based on whether the bit line is program inhibited or program enabled; for example, something like 4V. To enable programming the bit line BL is set at VSS and to program inhibit the bit line is raised to a high level from the sense amp, here a level VDDSA used for pre-charging bit lines that can be in the 2.5V-4V range. (More information on sense amps and pre-charge levels can be found in US patent publication number 2014-0003157.) On the source line, when programming CELSRC is set high (such as VDDSA) to shut off the transistors, and once verified or if non-selected CELSRC can be set at the threshold voltage of a depleted device, Vtd (~1V), to turn on the transistors.

Figure 19:
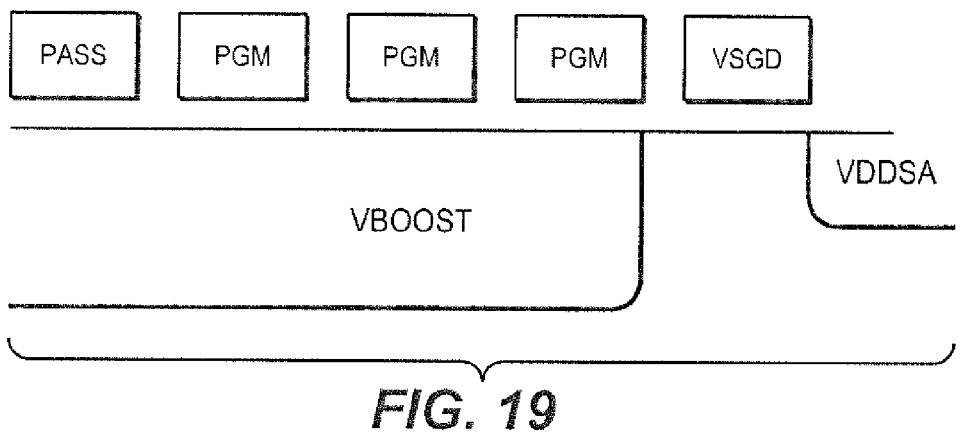
FIG. 19 represents the resultant channel boosting from the biasing shown in FIG. 18.

To adjust the selected drain select gates threshold voltages by programming them up, the bit line is set to the program enable level (VSS). This establishes the sort of situation that FIG. 19 illustrates schematically, where the PASS voltage is on the word lines (the end most of which is shown) and the programming voltage is on the selected drain select gates, boosting the channel to a level VBOOST, and the bit line is either at VSS to enable or, as shown, VDDSA to inhibit programming. Once biased, at set of programming pulses of VPGM is applied on the commonly controlled to the select transistors, with alternating verify operations between the pulses. Once the select gates verify as being tuned to the desired range, they are then locked out from further programming. In both the pulse and verify operations, as the control gates of the select transistors are commonly connected, the verify is a combined verify to determine if the set of transistors have, as a group, the desired collective threshold value for effective use as a single select transistor.

Under this arrangement, the VBOOST does not need to be particularly large in SGD programming (~3v to 4v range) and a largely conventional programming process can be used. Under this arrangement, an all bit line program can be done for the select gates to improve performance, whereas for the memory cells only every other or every fourth bit line are programmed concurrently in the BiCS type structure due to the amount of capacitive coupling the results from high density structure. By separating out the end most select gate, the others can be programmed without need of a charge pump to pre-charge bit lines to a higher than standard level, saving on power.

Figure 21:
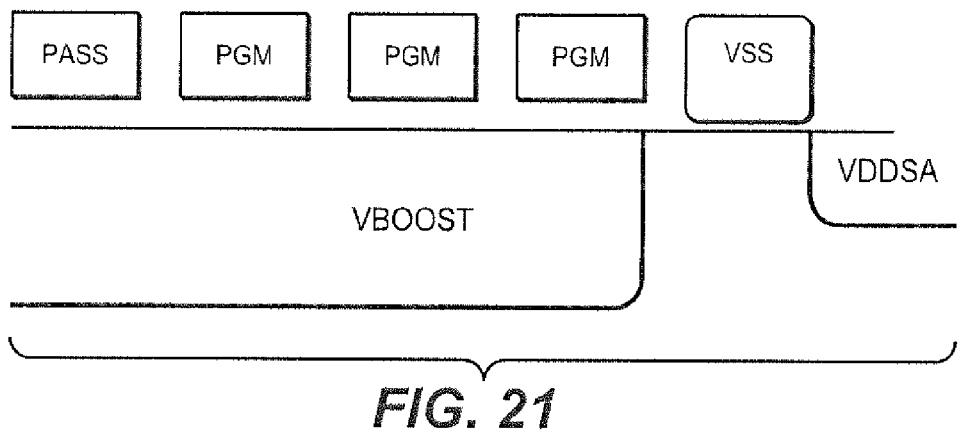
FIG. 21 represents the resultant channel boosting from the biasing shown in FIG. 20.
Figure 20:
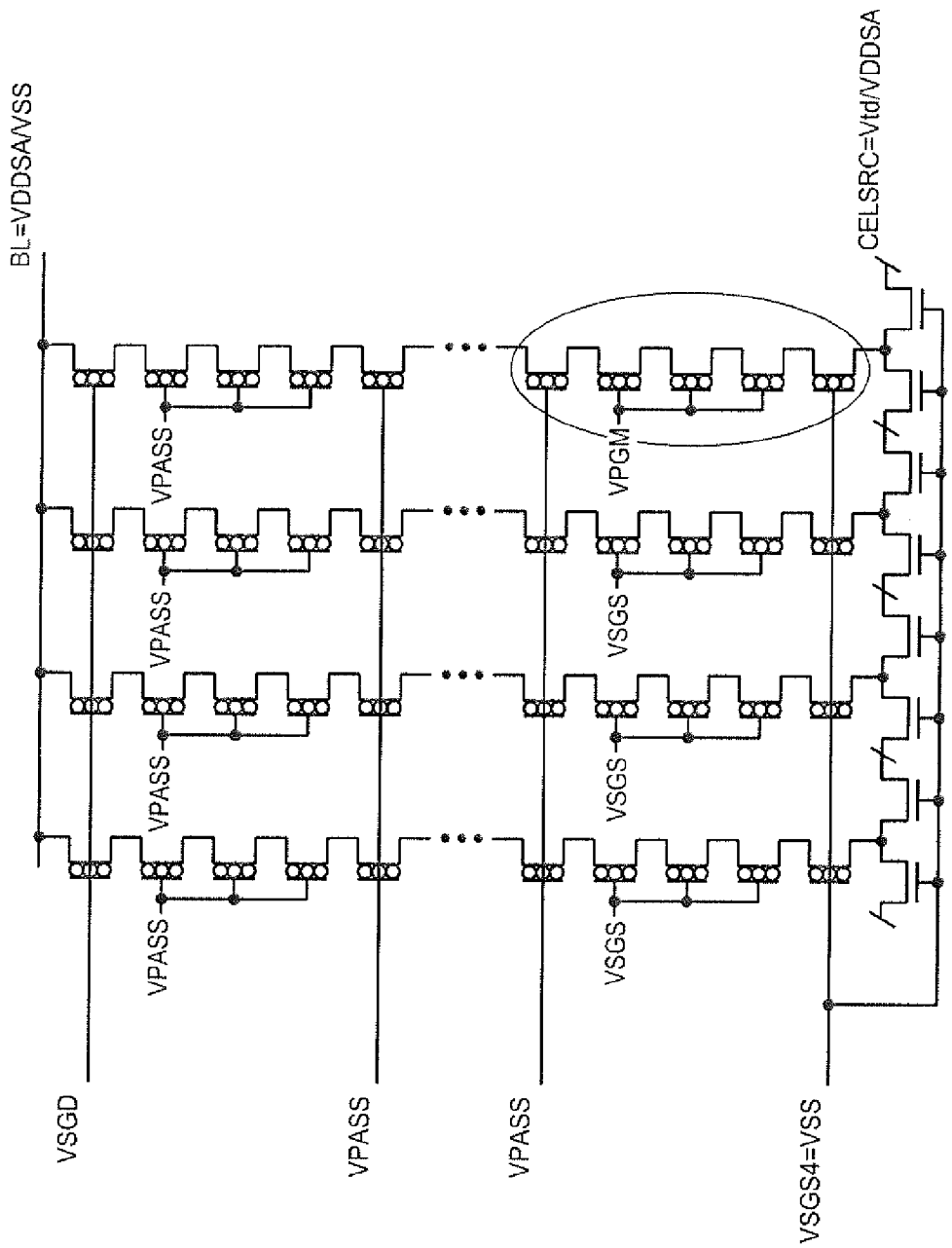
FIG. 20 illustrates an exemplary topology for the control gate connections of source side select gates and bias levels for their programming.

FIG. 20 is similar to FIG. 18, but for programming of the source side select gates. The biasing is largely as before, except that now on the selected (right most) NAND string, the commonly connected drain side select gates are also now at VPASS to provide channel boosting. This is illustrated in FIG. 21, that is source side equivalent of FIG. 19. The commonly connected gates of the source select gates then receive the programming pulses, alternated with a common verify operation. This can provide the same advantages as for the drain side process in terms of speed, power and accuracy, allowing for the individual programming of each finger's source side select gates.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

The invention claimed is:

1. A non-volatile semiconductor memory device, comprising:
a memory array structure including:
  a first bit line;
  a source line;
  a first NAND string comprising:
    a plurality of non-volatile memory cells connected in series between the source line and the first bit line;
    one or more serially connected source select transistors through which the memory cells are connected to the source line; and
    a plurality of serially connected drain select transistors through which the memory cells are connected to the first bit line, wherein the serially connected drain select transistors include a first drain select transistor and one or more second drain select transistors, wherein the second drain select transistors have a programmable threshold level and are connected to the first bit line through the first drain select transistor; and
  read/write circuitry connectable to the first bit line, the source line, control gates of the memory cells, and control gates of the source select and drain select transistors, whereby the second drain select transistors are programmed by applying a sequence of one or more common programming pulses concurrently to the control gates of the second drain select transistors while the first bit line is initially set to a program enable level, the source line is set high, the control gates of the memory cells are set at a pass level, one or more of the source select transistors are turned off, and the first drain select transistor is turned on.

2. The non-volatile semiconductor memory device of claim 1, wherein the second drain select transistors are further programmed by performing a verify operation subsequent to applying the sequence of pulses, wherein the second drain select transistors are commonly verified and, in response to verifying, the first bit line is set to a program inhibit level.

3. The non-volatile semiconductor memory device of claim 2, wherein the program enable level is ground.

4. The non-volatile semiconductor memory device of claim 2, wherein the program inhibit level is used in pre-charging bit lines by sense amp circuitry.

5. The non-volatile semionductor memory device of claim 2, wherein the control gate of the first drain select transistor is set at a level to be turned on when the first bit line is at the program enable level and turned off when the first bit line is at the program inhibit level.

6. The non-volatile semiconductor memory device of claim 2, wherein, in response to the verifying, the source line is set to a lower level.

7. The non-volatile semiconductor memory device of claim 1, wherein the memory array structure further includes:
a plurality of additional bit lines and a corresponding plurality of additional NAND strings, each constructed similarly to the first NAND string and being connected between the source line and the corresponding additional bit line;
a plurality of word lines, each connected to the control gate of a corresponding one of the memory cells in each of the NAND strings;
one or more source select lines, each connected to the control gate of a corresponding one of the source select transistors in each of the NAND strings;
a first drain select line connected to the control gate of the first drain select transistor in each of the NAND strings; and
one or more second drain select lines, each connected to the control gate of a corresponding one of the second drain select transistors in each of the NAND strings;
wherein the read/write circuitry is further connectable to the additional bit lines, the source line, the word lines, the source select lines and the drain select lines, whereby the second drain select transistors of selected ones of the additional NAND strings are programmable concurrently with the first drain select transistor by applying the sequence of programming pulses to the second select lines, setting the word lines to the pass level, setting the source select lines to low, setting the first drain select line to high, and wherein the bit lines corresponding to the selected additional NAND strings are initially set to a program enable level, and
wherein the second drain select transistors are further programmed by performing a verify operation subsequent to the pulses of the sequence, wherein the second drain select transistors of each NAND string are commonly verified and, in response to verifying, the corresponding bit line is set to a program inhibit level.

8. The non-volatile semiconductor memory device of claim 7, wherein when programming said second drain select transistors, the read/write circuitry initially concurrently enables adjacent bit lines; and, when programming the memory cells, the read/write circuitry does not concurrently enable the adjacent bit lines for programming.

9. The non-volatile semiconductor memory device of claim 1, wherein the non-volatile semiconductor memory device is formed as a monolithic three-dimensional semiconductor memory device.

10. The non-volatile semiconductor memory device of claim 9, wherein: the monolithic three-dimensional semiconductor memory device has a plurality of memory device levels vertically disposed above a silicon substrate, wherein said memory device levels have a plurality of the memory cells, each of which comprise a charge storage medium with a corresponding control gate horizontally disposed relative to said charge storage medium,
the memory cells in a memory device level are horizontally separated from each other and arranged in two or more horizontal rows of two or more memory cells,
at least one of said memory device levels have memory cells substantially vertically aligned with memory cells of a vertically adjacent memory device level, and
at least one control gate is common among at least two memory cells in one of said horizontal rows in one of said memory device levels and among at least two memory cells in a second one of said horizontal rows in said one of said memory device levels.

11. The non-volatile semiconductor memory device of claim 1, wherein the number of second drain select transistors is greater than one.

12. A non-volatile semiconductor memory device, comprising:
a memory array structure including:
a first bit line;
a source line;
a first NAND string comprising:
a plurality of non-volatile memory cells connected in series between the source line and the first bit line;
one or more serially connected drain select transistors through which the memory cells are connected to the first bit line; and
a plurality of serially connected source select transistors through which the memory cells are connected to the source line, wherein the serially connected source select transistors include a first source select transistor and one or more second source select transistors, wherein the second source select transistors have a programmable threshold level and are connected to the source line through the first source select transistor; and
read/write circuitry connectable to the first bit line, the source line, control gates of the memory cells, and control gates of the source select and drain select transistors, whereby the second source select transistors are programmed by applying a sequence of one or more common programming pulses concurrently to the control gates of the second source select transistors while the first bit line is initially set to a program enable level, the source line is set to high, the control gates of the memory cells are set at a pass level, the first source select transistor is turned off, and the drain select transistors are turned on.

13. The non-volatile semiconductor memory device of claim 12, wherein the second source select transistors are further programmed by performing a verify operation subsequent to applying the sequence of pulses, wherein the second source select transistors are commonly verified and, in response to verifying, the first bit line is set to a program inhibit level.

14. The non-volatile semiconductor memory device of claim 13, wherein the program enable level is ground.

15. The non-volatile semiconductor memory device of claim 13, wherein the program inhibit level is used in pre-charging bit lines by sense amp circuitry.

16. The non-volatile semiconductor memory device of claim 12, wherein the control gate of the one or more drain select transistors connected to the first bit line is set at a level to be turned on when the first bit line is at the program enable level and turned off when the first bit line is at the program inhibit level.

17. The non-volatile semiconductor memory device of claim 13, wherein, in response to the verifying, the source line is set to a lower level.

18. The non-volatile semiconductor memory device of claim 12, wherein the memory array structure further includes:
- a plurality of additional bit lines and a corresponding plurality of additional NAND strings, each constructed similarly to the first NAND string and being connected between the source line and the corresponding additional bit lines;
- a plurality of word lines, each connected to the control gate of a corresponding one of the memory cells in each of the NAND strings;
- one or more drain select lines, each connected to the control gate of a corresponding one of the drain select transistors in each of the NAND strings;
- a first source select line connected to the control gate of the first source select transistor in each of the NAND strings; and
- one or more second source select lines, each connected to the control gate of a corresponding one of the second source select transistors in each of the NAND strings;
- wherein the read/write circuitry is further connectable to the additional bit lines, the source line, the word lines, the source select lines and the drain select lines, whereby the second drain select transistors of selected ones of the additional NAND strings are programmable concurrently with the first drain select transistor by applying the sequence of programming pulses to the second select lines, setting the word lines to pass level, setting the drain select lines to high, the first source select line to low, and wherein the bit lines corresponding to the selected additional NAND strings are initially set to the program enable level, and
- wherein the second source select transistors are further programmed by performing a verify operation subsequent to the pulses of the sequence, wherein the second source select transistors of each NAND string are commonly verified and, in response to verifying, the corresponding bit line is set to a program inhibit level.

19. The non-volatile semiconductor memory device of claim 18, wherein when programming said second source select transistors, the read/write circuitry initially concurrently enables adjacent bit lines; and, when programming the memory cells, the read/write circuitry does not concurrently enable the adjacent bit lines for programming.

20. The non-volatile semiconductor memory device of claim 19, wherein the non-volatile semiconductor memory device is formed as a monolithic three-dimensional semiconductor memory device.

21. The non-volatile semiconductor memory device of claim 20, wherein:
- the monolithic three-dimensional semiconductor memory device has a plurality of memory device levels vertically disposed above a silicon substrate, wherein said memory device levels have a plurality of the memory cells, each of which comprise a charge storage medium with a corresponding control gate horizontally disposed relative to said charge storage medium,
- the memory cells in a memory device level are horizontally separated from each other and arranged in two or more horizontal rows of two or more memory cells,
- at least one of said memory device levels have memory cells substantially vertically aligned with memory cells of a vertically adjacent memory device level, and
- at least one control gate is common among at least two memory cells in one of said horizontal rows in one of said memory device levels and among at least two memory cells in a second one of said horizontal rows in said one of said memory device levels.

22. The non-volatile semiconductor memory device of claim 12, wherein the number of second source select transistors is greater than one.

* * * * *

UNITED STATES PATENT AND TRADEMARK OFFICE
CERTIFICATE OF CORRECTION

| | |
|---|---|
| PATENT NO. | : 9,305,648 B2 |
| APPLICATION NO. | : 14/464122 |
| DATED | : April 5, 2016 |
| INVENTOR(S) | : Nguyen et al. |

It is certified that error appears in the above-identified patent and that said Letters Patent is hereby corrected as shown below:

Claims

Column 15, Line 8, claim 5. Please replace "non-volatile semionductor memory" with --non-volatile semiconductor memory--.

Signed and Sealed this
Seventh Day of June, 2016

Michelle K. Lee
*Director of the United States Patent and Trademark Office*